United States Patent
Hayashi (10) Patent No.: US 10,973,130 B2
(45) Date of Patent: Apr. 6, 2021

(54) PRINTED WIRING BOARD

(71) Applicant: FANUC CORPORATION, Yamanashi (JP)

(72) Inventor: Shinichirou Hayashi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/415,458

(22) Filed: May 17, 2019

(65) Prior Publication Data

US 2019/0364673 A1 Nov. 28, 2019

(30) Foreign Application Priority Data

May 22, 2018 (JP) .............................. JP2018-098044

(51) Int. Cl.
*H05K 3/34* (2006.01)

(52) U.S. Cl.
CPC ....... *H05K 3/341* (2013.01); *H05K 2201/099* (2013.01); *H05K 2201/0989* (2013.01); *H05K 2201/10007* (2013.01); *H05K 2201/10621* (2013.01)

(58) Field of Classification Search
CPC .......... H05K 1/118; H05K 1/111; H05K 1/14; H05K 3/341; H05K 2201/0989; H05K 2201/099; H05K 2201/10007; H05K 2201/10621
See application file for complete search history.

(56) References Cited

U.S. PATENT DOCUMENTS

| | | | | |
|---|---|---|---|---|
| 5,400,950 A | * | 3/1995 | Myers .................. | H05K 3/3436 228/180.22 |
| 5,684,677 A | * | 11/1997 | Uchida .................. | H05K 3/303 361/770 |
| 5,707,714 A | | 1/1998 | Furutatsu et al. | |
| 5,726,861 A | * | 3/1998 | Ostrem ................ | H05K 3/3442 361/767 |
| 7,966,721 B2 | * | 6/2011 | Wada ..................... | H05K 3/305 29/840 |

FOREIGN PATENT DOCUMENTS

| | | |
|---|---|---|
| CN | 206005012 U | 3/2017 |
| JP | 61207077 U | 12/1986 |
| JP | H01266309 A | 10/1989 |
| JP | 210791 A | 1/1990 |
| JP | H03096710 A | 4/1991 |
| JP | 4105578 U | 9/1992 |

(Continued)

OTHER PUBLICATIONS

English Abstract and Machine Translation for Japanese Publication No. H06-310819 A, published Nov. 4, 1994, 4 pgs.

(Continued)

*Primary Examiner* — Hoa C Nguyen
(74) *Attorney, Agent, or Firm* — Fredriksen & Byron, P.A.

(57) ABSTRACT

A printed wiring board includes a substrate, a contact member arranged in contact with the substrate, and a wear resistant member fixed at least in an area on the substrate that comes in contact with the contact member, the wear resistant member having a wear resistance higher than that of the substrate.

12 Claims, 6 Drawing Sheets

(56) References Cited

FOREIGN PATENT DOCUMENTS

| JP | 538945 U | 5/1993 |
| JP | 6310819 A | 11/1994 |
| JP | 8288628 A | 11/1996 |
| JP | 8288672 A | 11/1996 |
| JP | 2004266995 A | 9/2004 |
| JP | 2008258501 A | 10/2008 |
| JP | 20094701 A | 1/2009 |

OTHER PUBLICATIONS

English Abstract and Machine Translation for Japanese Publication No. 2009-004701 A, published Jan. 8, 2009, 9 pgs.
English Abstract and Machine Translation for Japanese Publication No. H05-038945 U, published May 25, 1993, 4 pgs.
English Abstract and Machine Translation for Japanese Publication No. H02-010791 A, published Jan. 16, 1990, 3 pgs.
English Abstract and Machine Translation for Japanese Publication No. 08-288672 A, published Nov. 1, 1996, 6 pgs.
English Abstract and Machine Translation for Japanese Publication No. 2004-266995 A, published Sep. 24, 2004, 9 pgs.
English Abstract and Machine Translation for Japanese Publication No. 2008-258501 A, published Oct. 23, 2008, 6 pgs.
English Abstract and Machine Translation for Japanese Publication No. H04-105578 U, published Sep. 10, 1992, 3 pgs.
English Machine Translation for Japanese Publication No. JPH03-096710A, published Apr. 22, 1991, 6 pgs.
English Machine Translation for Japanese Publication No. JPH01-266309A, published Oct. 24, 1989, 9 pgs.
English Machine Translation of Decision to Grant a Patent mailed by Japan Patent Office (JPO) for Application No. JP2018-098044, Mar. 31, 2020, 2 pages.
Untranslated Decision to Grant a Patent mailed by Japan Patent Office (JPO) for Application No. JP2018-098044, Mar. 31, 2020, 3 pages.
English Machine Translation of Notification of Reasons for Refusal mailed by Japan Patent Office (JPO) for Application No. JP2018-098044, Jan. 14, 2020, 4 pages.
Untranslated Notification of Reasons for Refusal mailed by Japan Patent Office (JPO) for Application No. JP2018-098044, Jan. 14, 2020, 4 pages.
English Abstract for Japanese Publication No. JPH08288628 A, published Nov. 1, 1996, 1 pg.
Partial English Machine Translation for Japanese Publication No. 61-207077 U, published Dec. 27, 1986, 2 pgs.
English Abstract and Machine Translation for Chinese Publication No. CN206005012U, published Mar. 8, 2017, 5 pgs.

\* cited by examiner

PRINTED WIRING BOARD

CROSS-REFERENCE TO RELATED APPLICATION

This application is based upon and claims the benefit of priority from Japanese Patent Application No. 2018-098044 filed on May 22, 2018, the contents of which are incorporated herein by reference.

BACKGROUND OF THE INVENTION

Field of the Invention

The present invention relates to a printed wiring board.

Description of the Related Art

An electric circuit including electronic components is provided on a surface of a printed wiring board as disclosed in Japanese Laid-Open Patent Publication No. 08-288628. Additionally, support parts for supporting electronic components may be provided on the circuit board, and screws (fixing members) for fixing the circuit board to an external structure may also be inserted in the circuit board.

SUMMARY OF THE INVENTION

In the above printed wiring board, when vibration is externally applied, the support parts and fixing members rub against the surface of the circuit board. As a result, part of the surface of the circuit board may peel or be scraped off as foreign material. The foreign material may then cause a problem in the electronic device in which the printed wiring board is mounted.

It is therefore an object of this invention to provide a printed wiring board in which peeling of part of the circuit board due to friction with the components arranged thereon can be suppressed.

In one aspect of the present invention, a printed wiring board includes a substrate, a contact member arranged in contact with the substrate, and a wear resistant member fixed at least in an area on the substrate that comes in contact with the contact member, the wear resistant member having a wear resistance higher than that of the substrate.

According to the present invention, the wear resistant member having a higher wear resistance than the substrate is fixed to the area on the substrate where a contact member is disposed in the printed wiring board. Thereby, it is possible to suppress peeling of part of the substrate due to friction with the contact member.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The printed wiring board according to the present invention will be detailed below by describing preferred embodiments with reference to the accompanying drawings.

First Embodiment

Figure 1:
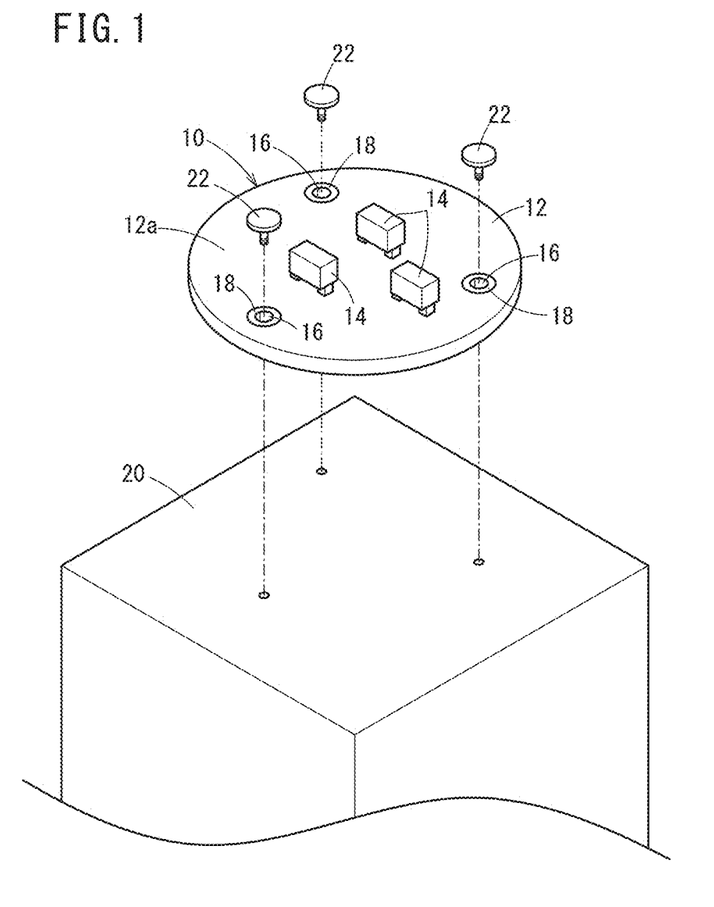
FIG. 1 is a perspective view showing the entire configuration of a printed wiring board according to a first embodiment.

FIG. 1 is a perspective view showing the entire configuration of a printed wiring board 10 according to the first embodiment.

As shown in FIG. 1, the printed wiring board 10 according to the first embodiment includes a substrate 12 and a plurality of electronic components 14 disposed on the substrate 12. A plurality of holes 16 are formed in the substrate 12 while a wear resistant member 18 is fixed around each of the multiple holes 16. Though the shape and material of the substrate 12 are not particularly limited, in the present embodiment the substrate 12 is disk-shaped and made of an insulating resin. Further, the wear resistant member 18 is made of a material having a higher wear resistance than that of the substrate 12. In the present embodiment, the wear resistant member 18 is a copper thin film.

Each of the multiple electronic components 14 is electrically connected to the wiring (not shown) formed on the substrate 12, whereby the printed wiring board 10 provides a predetermined function as an electric circuit when mounted on an electronic device. In the present embodiment, the wiring is made of copper, and each of the multiple electronic components 14 is electrically connected to the wiring by solder.

Further, a fixing member (screw 22) for fixing the substrate 12 to a base 20 in the electronic device is inserted into each of the multiple holes 16. In the present embodiment, the printed wiring board 10 is mounted on the base 20 in the electronic device by inserting screws 22 made of alloys through the holes 16 into threaded holes of the base 20.

The shape, the number and the layout of the holes 16 are not particularly limited. However, in the present embodiment it is assumed that the holes 16 have a circular contour in plan view for ease of explanation.

Figure 2:
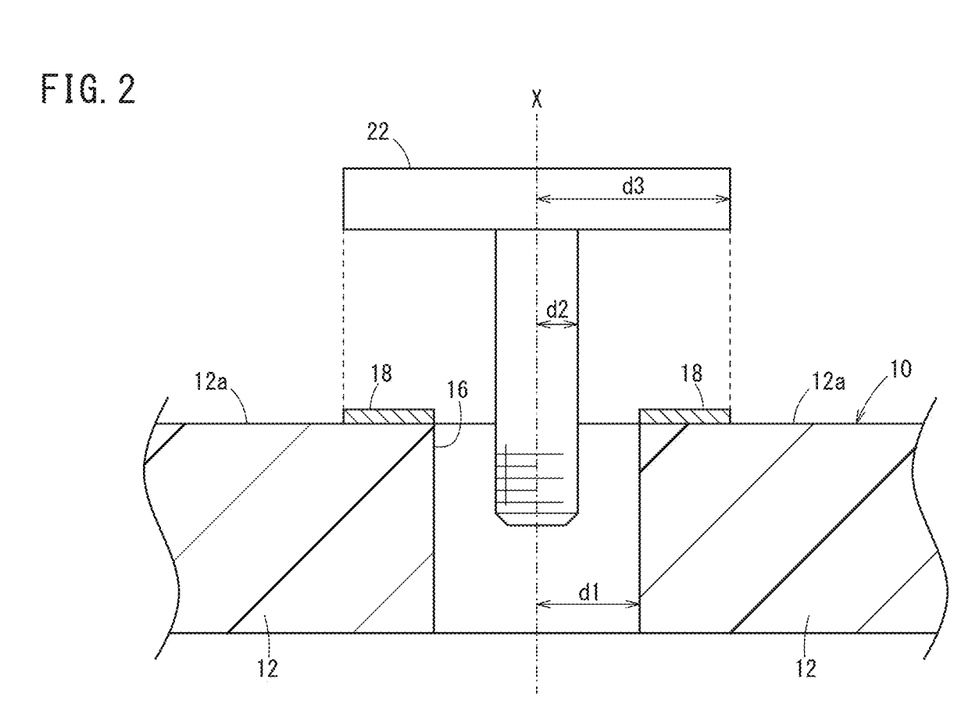
FIG. 2 is a sectional view showing a state where a screw is being inserted into a hole of a printed wiring board according to the first embodiment.

FIG. 2 is a sectional view showing a state in which the screw 22 is being inserted into the hole 16 of the substrate 12 in the printed wiring board 10 according to the first embodiment. In order to simplify the description, it is assumed that the screw 22 of this embodiment is inserted into the hole 16 with the central axis of the screw 22 aligned with the central axis X of the hole 16.

As shown in FIG. 2, the radius d1 of the hole 16 is greater than the radius d2 of the body of the screw 22 and smaller than the radius d3 of the head of the screw 22. Also, as already described, the wear resistant member 18 is fixed around the hole 16.

The wear resistant member 18 is fixed on a surface 12a of the substrate 12, such as to cover at least a partial area (contact area) on the surface 12a that comes in contact with the screw 22 when the wear resistant member 18 is not provided. In the present embodiment, as shown in FIG. 2, the wear resistant member 18 is fixed so as to cover an area (predetermined region) formed by removing the area of the hole 16 from a circular area having the radius d3 and which is concentric with the hole 16. Owing thereto, the wear resistant member 18 suppresses contact of the screw 22 with the surface 12a of the substrate 12 in a state where the screw 22 is inserted in the hole 16. Further, as already described, the wear resistant member 18 of the present embodiment is in the form of a thin film. Therefore, it is not necessary to consider the thickness of the wear resistant member 18 when the screw 22 is inserted into the hole 16 and the threaded hole of the base 20. That is, in the present embodiment it is not necessary to greatly change the specification of the screw 22 (for example, the length of the body portion of the screw 22 in the insertion direction) from the conventional one.

Figure 3A:
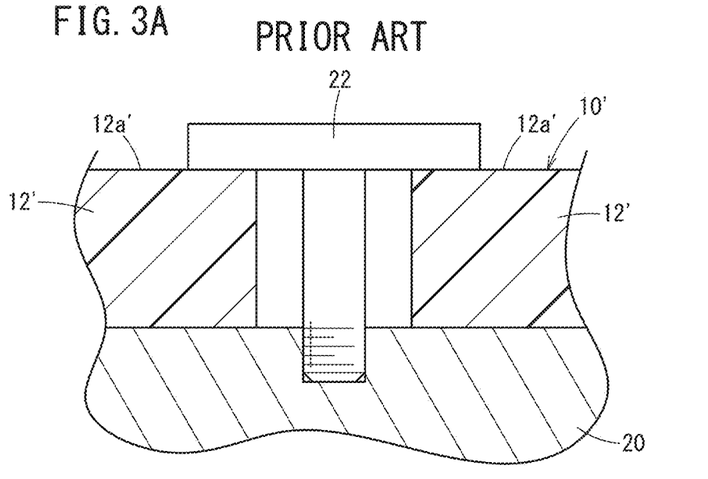
FIG. 3A is a sectional view showing a state of a conventional printed wiring board before vibration is applied to the circuit board.
Figure 3B:
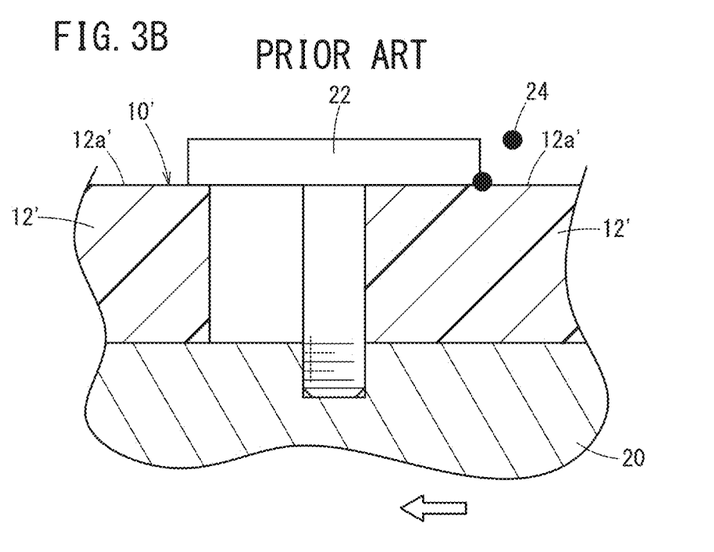
FIG. 3B is a sectional view showing a state of the conventional printed wiring board after vibration is applied to the circuit board.

FIGS. 3A and 3B are sectional views showing states of the substrate 12' of the conventional printed wiring board 10' before and after vibration is applied. FIG. 3A shows a state before vibration is applied, and FIG. 3B shows a state after vibration has been applied.

In the conventional printed wiring board 10', as shown in FIG. 3A the screw 22 and the surface 12a' of the substrate 12' are in direct contact with each other. Here, when vibration is applied to the electronic device (base 20) on which the substrate 12' is mounted, the substrate 12' may move relative to the screw 22 fixed to the base 20, in the direction of the arrow (in the direction parallel to the surface 12a'), for example, as shown in FIG. 3B. At this time, when the screw 22 and the surface 12a' rub against each other, part of the surface 12a' peels off as foreign material 24.

The foreign material 24 is dust which is not intended by the designer of the printed wiring board 10', and may cause a defect or failure in the electronic device on which the printed wiring board 10' is mounted. For example, when the electronic device is an optical encoder including a light emitter and a light receiver, the foreign material 24 adheres to the light emitter, so that the light receiver is hindered from correctly receiving the signal emitted from the light emitter.

Figure 4A:
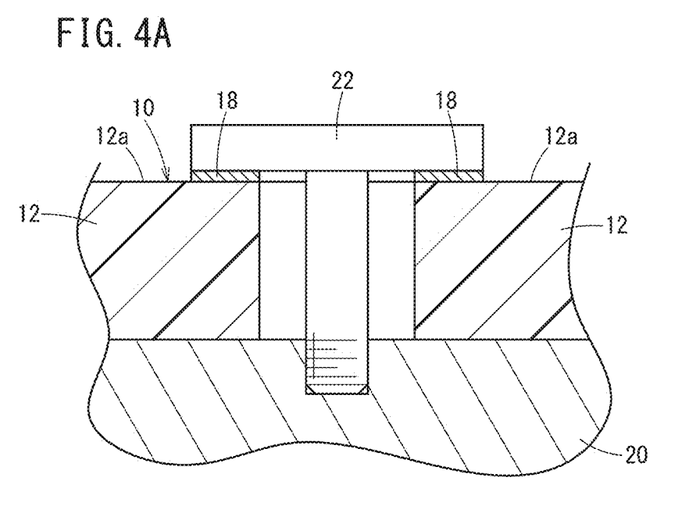
FIG. 4A is a sectional view showing a state of a printed wiring board according to the first embodiment, before vibration is applied to the circuit board.
Figure 4B:
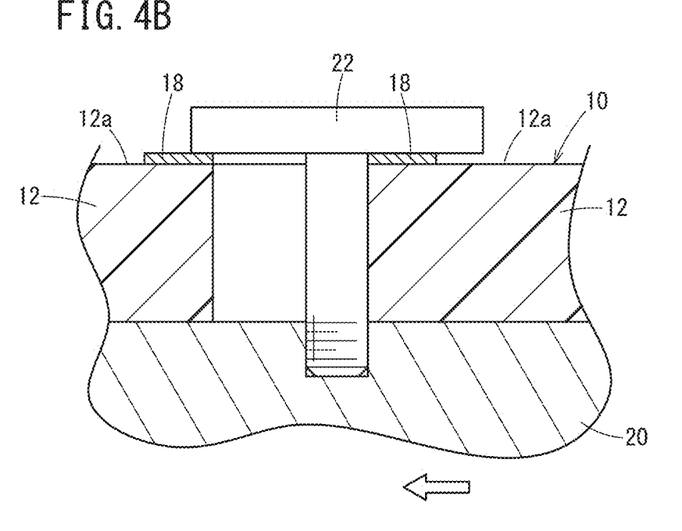
FIG. 4B is a view showing a state of the printed wiring board according to the first embodiment, after vibration is applied to the circuit board.

FIGS. 4A and 4B are sectional views showing states of the substrate 12 before and after vibration is applied to the printed wiring board 10 according to the first embodiment. FIG. 4A shows a state before the vibration is applied, and FIG. 4B shows a state after the vibration has been applied.

In the printed wiring board 10 according to the present embodiment, as compared with the conventional printed wiring board 10', the wear resistant member 18 is fixed to the contact area on the surface 12a of the substrate 12 as shown in FIG. 4A. Therefore, even if the position of the substrate 12 is moved in the direction of the arrow in the drawing relative to the screw 22 as shown in FIG. 4B, the wear resistant member 18 suppresses the peeling of part of the substrate 12.

As described above, in the printed wiring board 10, generation of foreign material 24 caused by partial peeling-off of the substrate 12 due to friction between the substrate 12 and the screw 22 in contact therewith can be suppressed.

Further, since the wear resistant member 18 has a higher wear resistance than the substrate 12, the peeling of the wear resistant member 18 itself due to the friction with the screw 22 is also suppressed. Furthermore, the wear resistant member 18 of the present embodiment is copper thin film, and the wear resistant member is fixed so as to cover a predetermined region determined in advance. Therefore, the fixation (formation) of the wear resistant member 18 can be performed simultaneously with formation of the wiring in the process of forming the copper wiring on the substrate 12.

[Modifications]

Although the first embodiment has been described above as an example of the present invention, it is of course possible to add various changes or improvements to the first embodiment. It is also apparent from the scope of the claims that the modes added with such modifications and improvements can be included in the technical scope of the invention.

(Modification 1)

Figure 5:
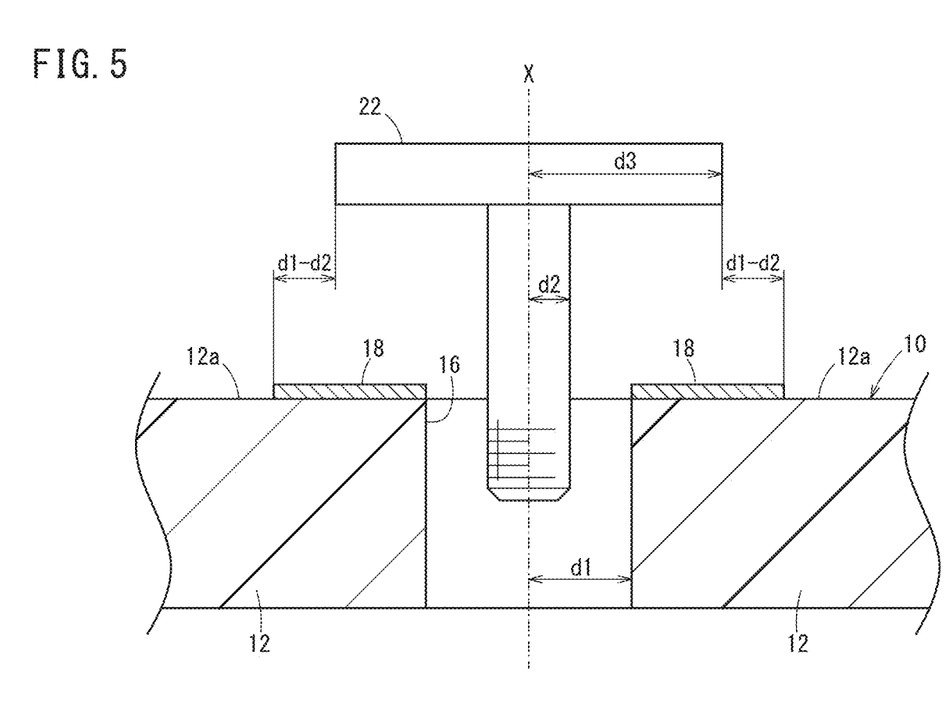
FIG. 5 is a sectional view showing a state where a screw is being inserted into a hole of a printed wiring board according to Modification 1 of the first embodiment.

FIG. 5 is a sectional view showing a state in which the screw 22 is being inserted into the hole 16 of the substrate 12 in the printed wiring board 10 according to Modification 1 of the first embodiment.

In Modification 1, an example in which the wear resistant member 18 is provided over a wider area than the example of FIG. 2 will be described. As shown in FIG. 5, the wear resistant member 18 may be fixed so as to cover an area formed by removing the area of the hole 16 from the circular area concentric with the hole 16 with a radius of d3+d1−d2. This area corresponds to the whole region in which the screw 22 and the surface 12a can overlap with each other in plan view when the position of the substrate 12 in the example of FIG. 2 is moved relative to the screw 22 in a direction parallel to the surface 12a. By fixing the wear resistant member 18 in this manner, the chance of the surface 12a and the screw 22 rubbing against each other is further suppressed when vibration is applied to the printed wiring board 10, and hence generation of foreign material 24 is further suppressed.

(Modification 2)

The wear resistant member 18 is not limited to thin film. For example, the wear resistant member 18 may be in the form of a block. This also prevents the substrate 12 and the screw 22 from being rubbed against each other, so that generation of the foreign material 24 can be suppressed.

(Modification 3)

For example, the material of wear resistant member 18 may be selected so as to be more wear resistant than the screw 22. This further reduces the risk of the wear resistant member 18 itself being peeled off.

(Modification 4)

For example, the wear resistant member 18 may be fixed not only to the surface 12a but also to the inner surface of the hole 16. With this configuration, the screw 22 and the inner surface of the hole 16 are prevented from rubbing against each other.

(Modification 5)

In the first embodiment described above, the contour of the hole 16 has been described as being circular, but the contour of the hole 16 does not necessarily need to be circular. For example, the contour of the hole 16 may be elliptical.

Second Embodiment

Next, a printed wiring board 10 according to a second embodiment will be described. Here, the same constituent elements as those described in the first embodiment will be allotted with the same reference numerals, and repeated description is omitted as appropriate.

Figure 6:
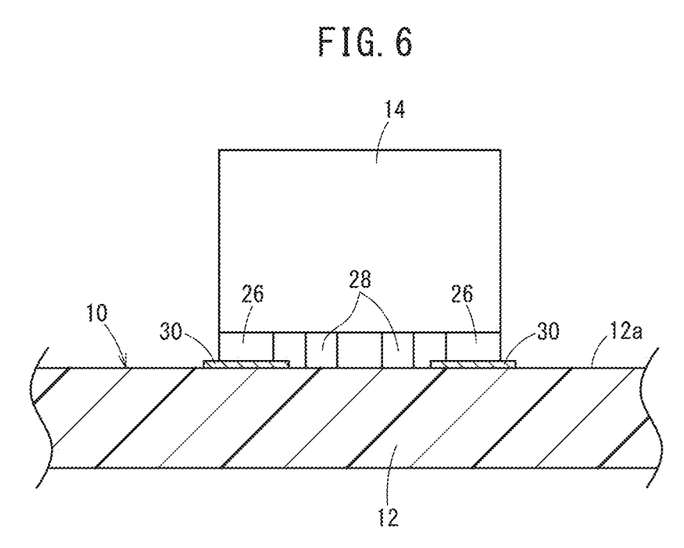
FIG. 6 is a sectional view of a printed wiring board according to a second embodiment.

FIG. 6 is a sectional view of the printed wiring board 10 according to the second embodiment.

In the second embodiment, as shown in FIG. 6, support parts 26 for supporting an electronic component 14 are disposed on the substrate 12. The support parts 26 provide the function of legs of the electronic component 14 so as to reduce heavy load applied to soldered joint portions 28 in which the wiring (not shown) on the substrate 12 and the electronic component 14 are electrically connected. The material of the support part 26 is not particularly limited, but it is assumed in the present embodiment that the support part is made of an alloy.

Further, a thin-film wear resistant member 30 is fixed to the surface 12a of the substrate 12. The wear resistant member 30 is fixed so as to cover a predetermined region including at least a partial area (contact area) on the surface 12a that is in contact with the support part 26 when the wear resistant member 30 is not provided. The wear resistant member 30 is formed of a material having a wear resistance higher than that of the substrate 12. In the present embodiment, the substrate 12 is made of resin, and the wear resistant member 30 is made of copper.

Furthermore, in the present embodiment, the range of the predetermined region is determined so as not to overlap with the soldered joint portions 28 and the wiring. That is, the wear resistant member 30 made of copper is electrically separated from the soldered joint portions 28 and the wiring on the substrate 12. Thus, it is possible to prevent the wear resistant member 30 from affecting operation of the electronic component 14 and the wiring on the substrate 12. Furthermore, the wear resistant member 30 of the present embodiment is in the form of a thin film. Therefore, it is not necessary to consider the thickness of the wear resistant member 30 when the support part 26 is arranged on the substrate 12. That is, in the present embodiment, it is not necessary to significantly change the specification of the support part 26 (for example, the length of the leg attached to the electronic component 14) from the conventional configuration.

Here, a problem that arises when the wear resistant member 30 is not fixed on the substrate 12 will be described. When the printed wiring board 10 is mounted on the electronic device and vibration is applied to the electronic device, the vibration is also transmitted to the electronic component 14 and the support part 26 on the substrate 12. At this time, the support part 26 and the substrate 12 vibrate individually, so that the support part 26 rubs against the surface 12a of the substrate 12, and as a result, part of the substrate 12 peels off, resulting in generation of foreign material 24.

However, according to the second embodiment, the wear resistant member 30 prevents the surface 12a of the substrate 12 from rubbing against the support part 26. As a result, the electronic component 14 is supported by the support part 26 while generation of foreign material 24 resulting from partial peeling of the substrate 12 due to friction between the substrate 12 and the support part 26 disposed thereon can be suppressed. Further, since the wear resistant member 30 has a higher wear resistance than the substrate 12, the peeling of the wear resistant member 30 itself due to the friction with the support part 26 is also suppressed. Furthermore, the wear resistant member 30 of the present embodiment is given in the form of copper thin film, and the wear resistant member is fixed so as to cover a predetermined region determined in advance. Therefore, the fixation (formation) of the wear resistant member 30 can be performed simultaneously with formation of the wiring in the process of forming the copper wiring on the substrate 12.

[Modifications]

Although the second embodiment has been described above as an example of the present invention, it goes without saying that various modifications and improvements can be added to the second embodiment. It is also apparent from the scope of the claims that the modes added with such modifications and improvements can be included in the technical scope of the present invention. For example, the above embodiments and Modifications may be arbitrarily combined within the scope of the present invention as long as no inconsistency occurs.

[Technical Ideas Obtained from Embodiment]

Technical ideas that can be grasped from the above-described embodiment and Modifications will be described below.

The printed wiring board (10) includes: a substrate (12); a contact member (22, 26) arranged in contact with the substrate (12); and a wear resistant member (18, 30) fixed at least in an area on the substrate (12) that comes in contact with the contact member (22, 26), the wear resistant member having a wear resistance higher than that of the substrate (12).

With this configuration, it is possible to avoid such a situation that part of the substrate (12) peels off due to friction between the substrate (12) and the contact member (22, 26) in contact therewith to thereby generate foreign material (24). Further, since the wear resistance of the wear resistant member (18, 30) is higher than that of the substrate (12), the peeling of the wear resistant member (18, 30) itself due to the friction with the contact member (22, 26) is also suppressed.

The area may be a predetermined region determined in advance. This suppresses generation of foreign material (24) caused by partial peeling-off of the substrate (12) due to friction between the substrate (12) and the contact member (22, 26) in contact therewith. Further, since the wear resistant member (18, 30) is higher in wear resistance than the substrate (12), the peeling of the wear resistant member (18, 30) itself due to the friction with the contact member (22, 26) is also suppressed.

The wear resistant member (18, 30) may be a thin film. This eliminates the need to consider the thickness of the wear resistant member (18, 30) when the contact member (22, 26) is placed on the substrate (12).

The wear resistant member (18, 30) may be made of copper. This suppresses generation of foreign material (24) caused by partial peeling-off of the substrate (12) due to friction between the substrate (12) and the contact member (22, 26) in contact therewith.

The wear resistance of the wear resistant member (18, 30) may be higher than the wear resistance of the contact member (22, 26). This further reduces the risk of the wear resistant member (18, 30) peeling off due to friction with the contact member (22, 26), for example.

The contact member (22) may be a fixing member configured to be inserted in a hole (16) formed in the substrate (12) to thereby fix the substrate (12) to an external structure (20). This suppresses, for example, generation of foreign material (24) caused by partial peeling-off of the substrate (12) due to friction between the substrate (12) and the contact member (22) in contact therewith, and the printed wiring board (10) can be mounted on the base (20) in an electronic device.

The contact member (26) may be a support part configured to support an electronic component (14) mounted on the substrate (12). Thus, the electronic component (14) can be supported by the support part (26) while generation of foreign material (24) caused by partial peeling-off of the substrate (12) due to friction with the support part (26) arranged on the substrate (12) can be suppressed.

What is claimed is:

1. A printed wiring board comprising:
   a substrate;
   a contact member arranged in contact with the substrate; and
   a wear resistant member fixed at least in an area on the substrate that comes in contact with the contact member, the wear resistant member having a wear resistance higher than that of the substrate, to prevent the substrate from wearing due to the contact member contacting and rubbing against the substrate;
   wherein
   the contact member contacts the wear resistant member in a manner that the contact member may rub against the wear resistant member,
   the wear resistance of the wear resistant member is higher than a wear resistance of the contact member.

2. The printed wiring board according to claim 1, wherein:
   the substrate includes a hole formed therein; and
   the contact member is a fixing member configured to be inserted in the hole to thereby fix the substrate to an external structure.

3. The printed wiring board according to claim 1, wherein the contact member is a support part configured to support an electronic component mounted on the substrate.

4. The printed wiring board according to claim 1, wherein one wear resistant member is provided for one contact member.

5. The printed wiring board according to claim 1, wherein the area is a predetermined region determined in advance.

6. The printed wiring board according to claim 1, wherein the wear resistant member is a thin film.

7. The printed wiring board according to claim 1, wherein the wear resistant member is made of copper.

8. A printed wiring board comprising:
   a substrate;
   a contact member arranged in contact with the substrate; and
   a wear resistant member fixed at least in an area on the substrate that comes in contact with the contact member, the wear resistant member having a wear resistance higher than that of the substrate, to prevent the substrate from wearing due to the contact member contacting and rubbing against the substrate,
   wherein the contact member is a support part configured to support an electronic component mounted on the substrate, and
   the contact member contacts the wear resistant member in a manner that the contact member may rub against the wear resistant member.

9. The printed wiring board according to claim 8, wherein one wear resistant member is provided for one contact member.

10. The printed wiring board according to claim 8, wherein the area is a predetermined region determined in advance.

11. The printed wiring board according to claim 8, wherein the wear resistant member is a thin film.

12. The printed wiring board according to claim 8, wherein the wear resistant member is made of copper.

* * * * *